United States Patent

Riederer et al.

[11] Patent Number: 5,225,780
[45] Date of Patent: Jul. 6, 1993

[54] ULTRA-FAST NMR SCANS WITH PREPARATION PHASE

[75] Inventors: Stephen J. Riederer, Rochester, Minn.; Anna E. H. Bampton, Richmond, Va.

[73] Assignee: Mayo Foundation for Medical Education Research, Milwaukee, Minn.

[21] Appl. No.: 742,116

[22] Filed: Aug. 8, 1991

[51] Int. Cl.⁵ ............................................. G01R 33/20
[52] U.S. Cl. .................................................... 324/309
[58] Field of Search ............... 324/300, 307, 309, 312, 324/313, 314, 318, 322; 128/653.2, 653.5

[56] References Cited

U.S. PATENT DOCUMENTS

| | | | |
|---|---|---|---|
| 5,077,524 | 12/1991 | Hurd et al. | 324/318 |
| 5,113,865 | 5/1992 | Maeda et al. | 324/307 |
| 5,122,746 | 6/1992 | King et al. | 324/307 |

OTHER PUBLICATIONS

A. E. Holsinger, F. Farzaneh, S. J. Riederer, *Improved $T_1$ Contrast In Ultra-Fast Scans,* SMRI '90 Eighth Annual Meeting Program and Abstracts, #363, Feb. 24–28, 1990.

*Primary Examiner*—Michael J. Tokar
*Attorney, Agent, or Firm*—Quarles & Brady

[57] ABSTRACT

An ultra-fast NMR scan includes a preparatory phase, a stabilization phase and a data acquisition phase. Image contrast is enhanced by an inversion-recovery-like preparation phase and this is followed by a set of fast pulse sequences in which magnetization is allowed to stabilize. Image data is then acquired during the final phase using a set of GRASS pulse sequences executed in a centric view order.

6 Claims, 3 Drawing Sheets

ULTRA-FAST NMR SCANS WITH PREPARATION PHASE

BACKGROUND OF THE INVENTION

The field of the invention is nuclear magnetic resonance imaging methods and systems. More particularly, the invention relates to ultra-fast scans in which all of the NMR data for an image is acquired in less than one minute.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or a spin-echo signal.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques. There are two well known SSFP pulse sequences used to produce images. The first is called gradient refocused acquired steady-state (GRASS) and it utilizes a readout gradient $G_x$ to shift the peak in the S+ signal that is produced after each RF excitation pulse toward the center of the pulse sequence. This pulse sequence is shown in FIG. 4. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data. To preserve the steady-state equilibrium, the effects of the phase encoding gradient pulse are nullified by a corresponding $G_y$ rewinder gradient pulse after the NMR signal has been acquired and before the next pulse sequence begins as described in U.S. Pat. No. 4,665,365. The phase encoding gradient pulse $G_y$ is stepped through a sequence of values during a scan to acquire NMR data throughout k-space. In a 128 view scan, for example, the phase encoding gradient is stepped in sequence from $k_y = -64$ through $k_y = +64$.

The second well known SSFP pulse sequence is called contrast enhanced fast imaging (CE-FAST) and it utilizes the S- signal that is produced just prior to each RF excitation pulse. In this pulse sequence the acquired NMR signal is an S- echo signal caused by the gradient refocusing of the transverse magnetization which would otherwise refocus at the next RF excitation pulse. For a detailed discussion of the CE-FAST pulse sequence, reference is made to an article by R. C. Hawkes and S. Patz entitled "Rapid Fourier Imaging Using Steady-State Free Precision", published in *Magnetic Resonance in Medicine* 4, pp. 9-23 (1987). It also includes a phase encoding pulse which is stepped sequentially through a set of views during the scan.

While scans performed with SSFP pulse sequences are much shorter than conventional scans, the contrast in the reconstructed images is lower due to the use of limited flip-angles and the acquisition of data under steady state conditions. More recently, ultra-short TR snapshot NMR imaging with higher image contrast has been described by A. E. Holsinger et al in abstract number 363 presented at the Eighth Annual Meeting of the Society of Magnetic Resonance Imaging held in February 1990 and entitled "Improved T1 Contrast In Ultra-Fast Scans." Snapshot imaging employs two phases: a contrast preparation phase and a data acquisition phase. The contrast preparation phase consists of a sequence of pulses which set up the desired contrast. For example, a selective 180° RF excitation pulse followed by a wait time (T1) sets up T1-dependent longitudinal magnetization. The subsequent data acquisition phase consists of a series of very fast acquisition sequences such as GRASS, FLASH or CE-FAST, which operates on the prepared magnetization, gradually moving the spin system toward the steady state condition characteristic of SSFP pulse sequences. Prior to reaching this steady state condition, however, the image contrast is enhanced and resembles the contrast established by the preparation phase, which is comparable to conventional spin-echo and inversion recovery sequences.

SUMMARY OF THE INVENTION

The present invention is an improved ultra-short TR snapshot NMR scan in which a third phase is interposed between the contrast preparation phase and the data acquisition phase, and a centric view ordering is employed during the data acquisition phase to further exploit the contrast enhancement provided by the contrast preparation. More specifically, the present invention is a method and system for performing an NMR scan comprised of a contrast preparation phase in which an RF excitation pulse is produced and followed by a preselected period of time which allows recovery of the magnetization; followed by a stabilization phase in which a series of fast pulse sequences are executed, but no NMR data is acquired; and followed by a data acquisition phase in which a series of fast pulse sequences are executed and NMR data is acquired. The invention is further characterized by the order in which the NMR data is acquired during the last phase, and in particular, by the acquisition of the central k-space views first in a centric view order.

A general object of the invention is to reduce image artifacts in an ultra-short TR snapshot NMR scan. It has been discovered that when using larger flip-angles during the data acquisition phase an oscillation in the magnetization occurs at the beginning of the data acquisition phase. This causes smearing in the phase encoding direction in the reconstructed image when the central views of k-space are acquired first. The stabilization phase comprised of a set of pulse sequences in which NMR data is not acquired allows these oscillations to subside before image data is acquired during the subsequent data acquisition phase.

Another general object of the invention is to enhance image contrast in an ultra-short TR snapshot NMR scan. Because the central phase encoding views contain most of the signal power (the central 10% of the views have 80% of the power), image contrast is largely determined by the magnetization state at the time these central views are acquired. The centric view order according to the present invention acquires data from the central phase encoding views first and works its way outward in each direction $(-1, +1, -2, +2, -3, +3 \ldots -127, +127, -128, +128)$. As a result, the enhanced contrast provided by the contrast preparation phase is utilized to greatest effect on the central phase encoding views and the peripheral phase encoding views are acquired last when the magnetization is approaching the steady state condition of reduced image contrast.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
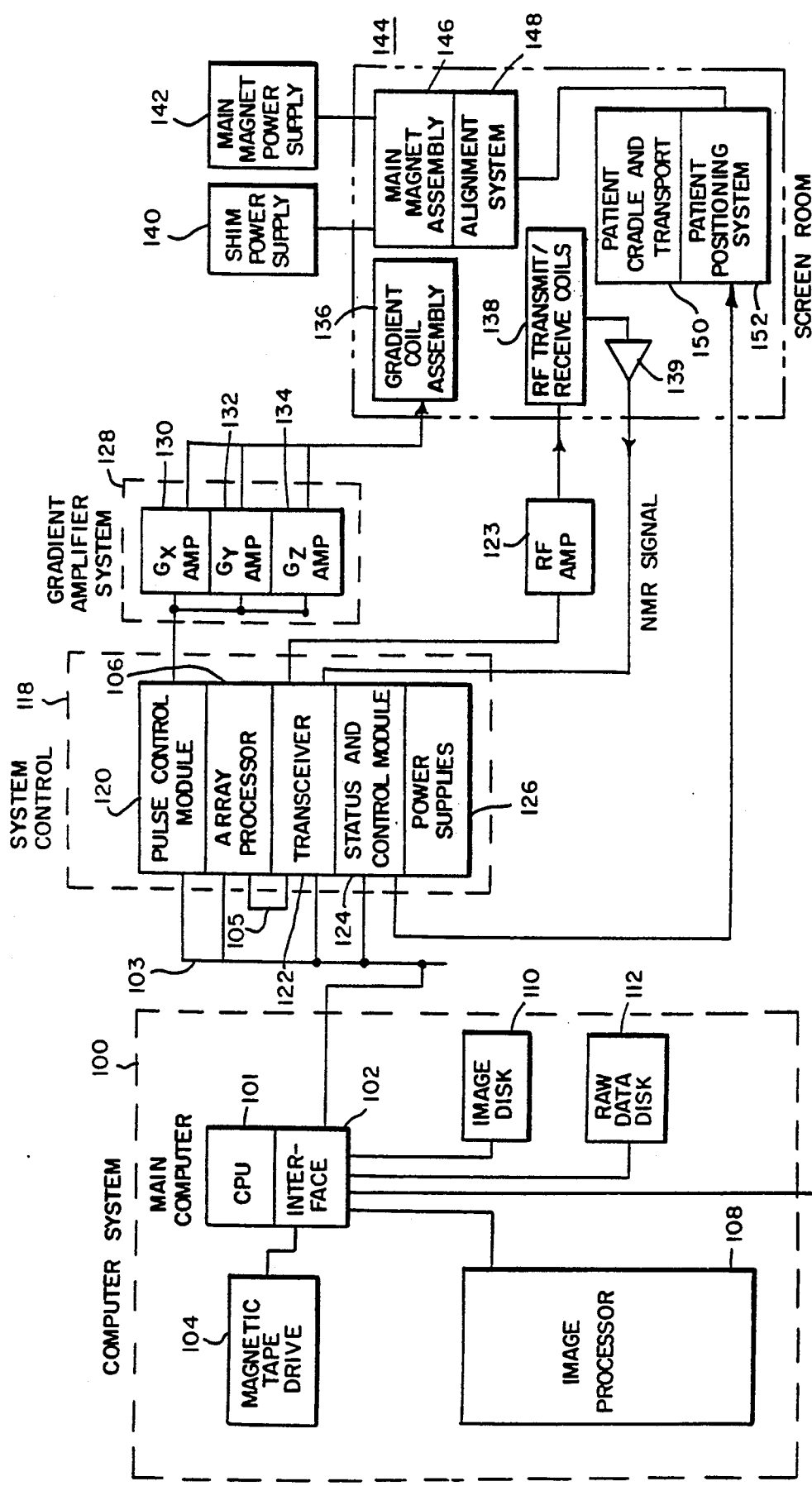
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146'. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
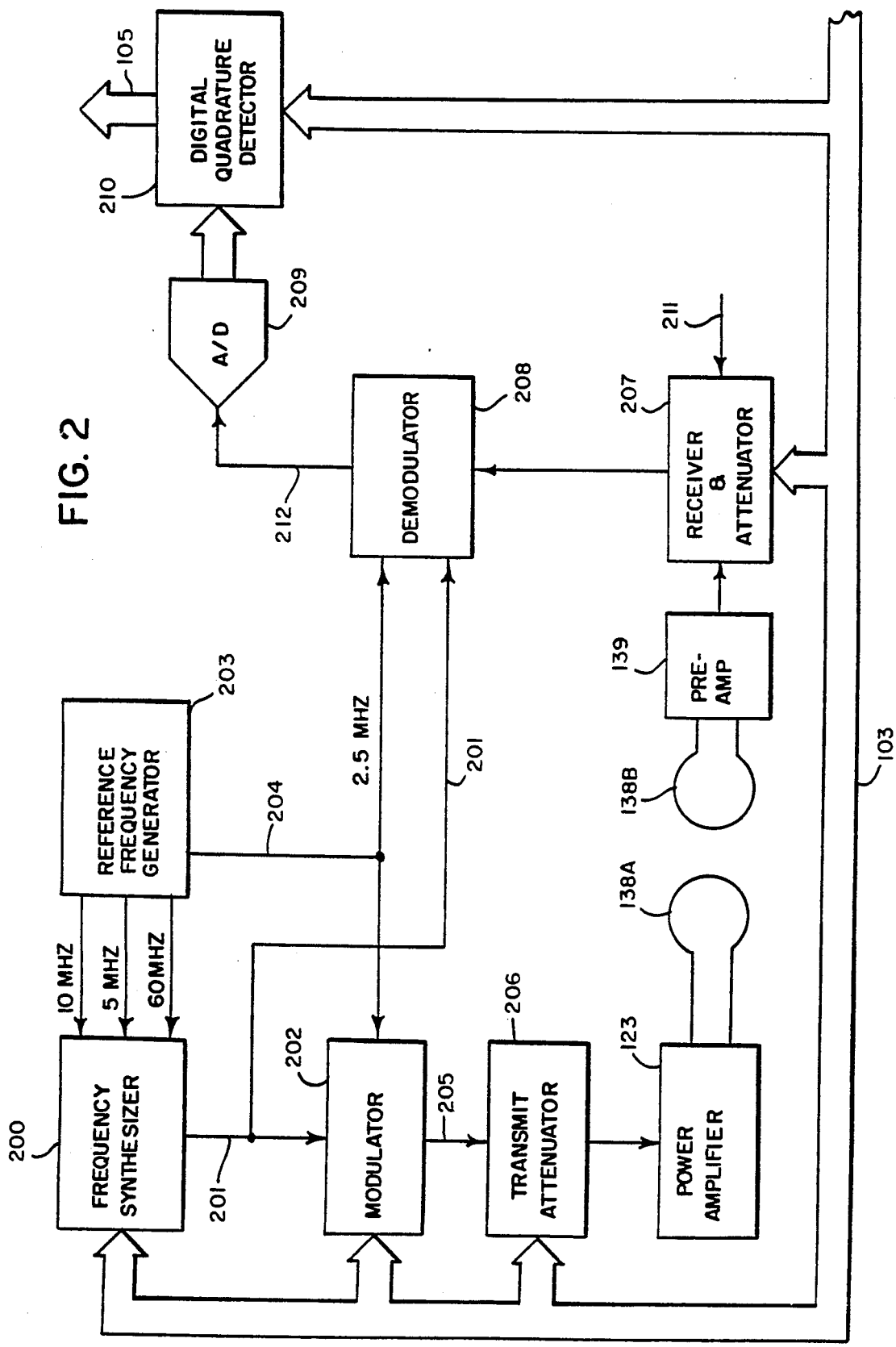
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 4:
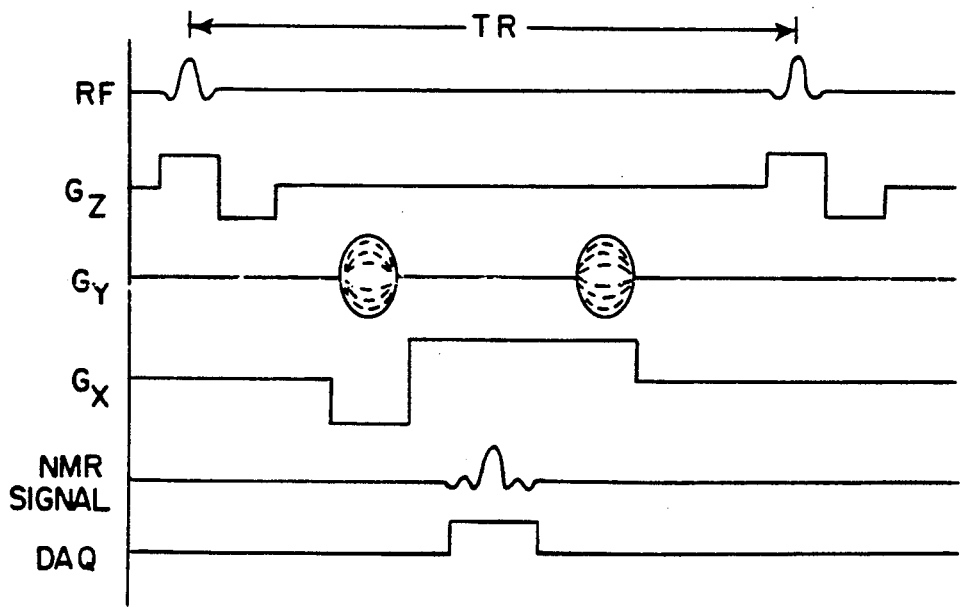
FIG. 4 is a graphic view of a GRASS pulse sequence which is employed in the fast scan of FIG. 3.

The present invention is practiced using the NMR system described above. More specifically, the main computer 101 is programmed to carry out a scan in which the pulse control module 120 directs the other system elements to acquire NMR data using a series of GRASS pulse sequences. A conventional GRASS pulse sequence such as that shown in FIG. 4 is employed in the scan. Its repetition rate TR is set to 7.06 milliseconds and its echo time TE is set to 3.51 milliseconds in the preferred embodiment. A total of 128 phase encoding views are acquired for each image and a 30° flip-angle is employed for each RF excitation pulse.

Figure 3:
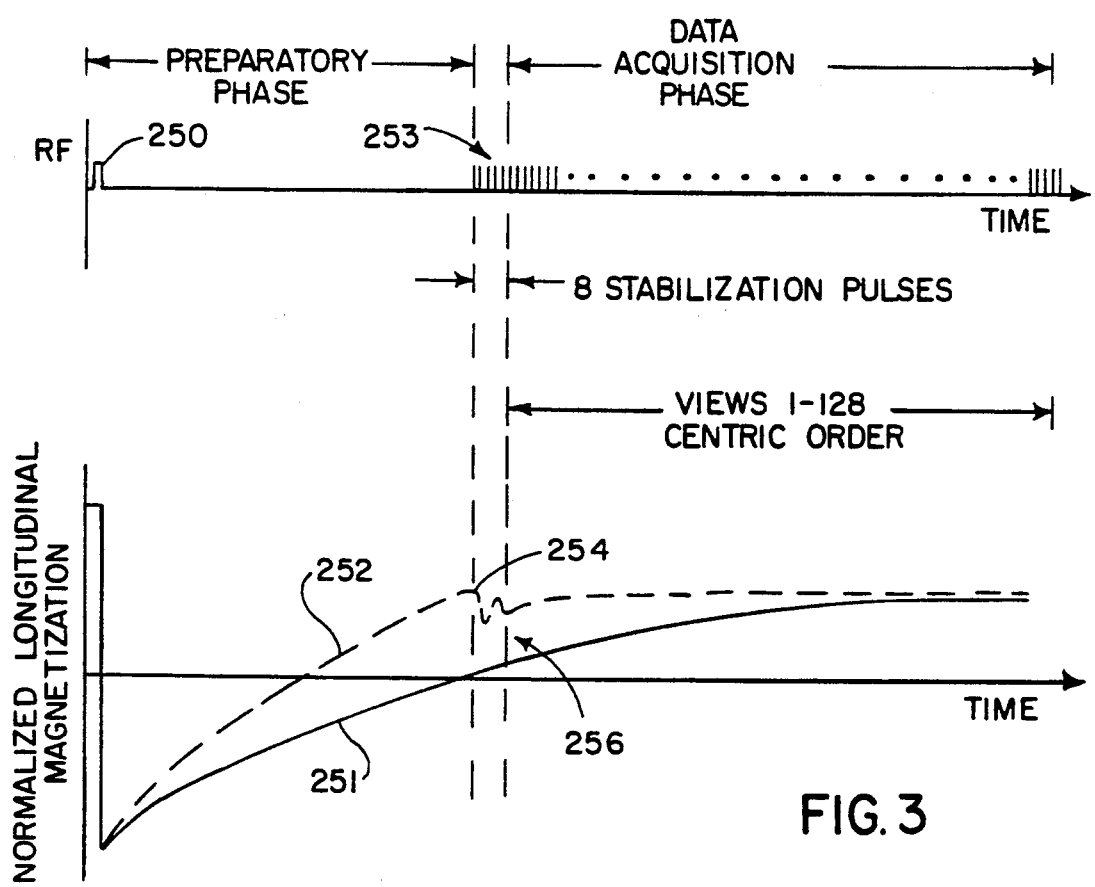
FIG. 3 is a graphic representation of the fast scan according to the present invention which is performed with the NMR system of FIG. 1.

The scan is illustrated in FIG. 3 and includes a T1 preparatory phase which is initiated by a 180° RF inversion pulse. This is followed by a period of 570 milliseconds in which the inverted longitudinal magnetization of both gray matter and white matter recover according to their respective $T_1$ relaxation times. At the end of this period the white matter magnetization, indicated by the dashed curve 252, has recovered to a value greater than zero, and the gray matter magnetization, indicated by the solid curve 251, has substantially recovered to zero. Approximately maximum contrast is provided between these two tissue types at the end of the preparatory phase.

The preparatory phase is followed by a stabilization phase in which eight consecutive GRASS pulse sequences are executed as indicated at 253. No data is acquired during this 56 millisecond phase, and no phase encoding gradients are applied. As shown at 254, oscillations which occur in the NMR signal produced by white matter die out during this stabilization phase so that when data is acquired during the final phase, no artifacts are produced in the reconstructed image.

During the final, data acquisition phase 128 GRASS pulse sequences are executed and 128 corresponding NMR signals are acquired. These acquired signals are employed to reconstruct a 128 by 128 pixel image using a conventional 2DFT reconstruction technique. The important consideration during this phase of the scan is to acquire the 128 phase encoding views in a centric view order. The centric view order is an order which starts at the center of k-space and works outward in both directions. This insures that the central views are acquired first when the contrast between gray matter signal 251 and white matter signal 252 is maximum as indicated at 256. This provides an image with enhanced contrast and increased diagnostic value since the central 10% of the views provide 80% of the signal power in the image. This phenomenon is a result of the Fourier transformation process used to reconstruct the image.

In the preferred embodiment the centric view order starts with the central view ($k_y=0$) and alternates with the next view to each side of the executed central views ($k_y=-1, +1, -2, +2$ etc.) until all 128 views have been executed.

It should be apparent to those skilled in the art that many variations are possible from the preferred embodiment of the invention without departing from the spirit of the invention. For example, other preparatory methods can be employed during the preparatory phase to set up the desired contrast mechanism used to produce the desired image. Other fast pulse sequences can be employed in the stabilization and data acquisition phases, such as CE-FAST, Spoiled GRASS and FLASH and the flip-angle used in the pulse sequence can be altered to provide the desired contrast. Also, the centric view order can be altered for use with baseline correction methods. For example, the view order $-1, +1, +2, -2, -3, +3, +4$ etc. may be used with RF chopping for baseline correction while closely following the desired centric view order. In addition, while eight RF pulses are employed during the stabilization phase of the preferred scan, fewer may be used.

We claim:

1. In an NMR system for performing a scan and acquiring a set of NMR data from which an image is reconstructed, an improved method for performing the scan which comprises:
   a) executing a preparatory phase pulse sequence in which an RF excitation pulse is applied to a spin system being imaged and a preselected time interval transpires to enable longitudinal magnetization of the excited spin system to evolve such that a desired image contrast will be produced;
   b) executing a set of stabilization phase pulse sequences in which one or more RF excitation pulses are applied to the spin system;
   c) executing a set of steady-state free precision pulse sequences in which a set of RF excitation pulses are applied to the spin system and a corresponding set of NMR data is acquired; and
   d) reconstructing an image from the acquired set of NMR data.

2. The improved method as recited in claim 1 in which the stabilization phase pulse sequences are substantially the same as the steady-state free precision pulse sequences.

3. The improved method as recited in claim 1 in which the preparatory phase pulse sequence includes a 180° RF inversion pulse which is applied to the spin system.

4. The improved method as recited in claim 1 in which each steady-state free precision pulse sequence includes a phase encoding gradient pulse which is stepped through a sequence of values as the set of steady-state free precision pulse sequences is executed to acquire the NMR data in a centric view order.

5. The improvement as recited in claim 1 in which the steady-state free precision pulse sequence is a GRASS pulse sequence.

6. In an NMR system for performing a scan and acquiring a set of NMR data from which an image is reconstructed, an improved method for performing the scan which comprises:
   a) executing a preparatory phase pulse sequence in which an RF excitation pulse is applied to a spin system being imaged and a preselected time interval transpires to enable longitudinal magnetization of the excited spin system to evolve such that a desired image contrast will be produced;
   b) executing a stabilization phase in which oscillations in the magnetization produced by the preparatory phase is reduced;
   c) executing a set of steady-state free precision pulse sequences in which a set of RF excitation pulses are applied to the spin system, a corresponding set of phase encoding gradient pulses are applied to the spin system and stepped through a centric view order sequence of values, and a corresponding set of NMR data is acquired; and
   d) reconstructing an image from the acquired set of NMR data.

* * * * *

UNITED STATES PATENT AND TRADEMARK OFFICE
CERTIFICATE OF CORRECTION

Patent No.   : 5,225,780
Dated        : July 6, 1993
Inventor(s)  : S.J. Riederer, et al.

It is certified that error appears in the above-identified patent and that said Letters Patent is hereby corrected as shown below:

Column 1, line 3,

This invention was made with U.S. Government support awarded by the National Institutes of Health (NIH) Grant No.: CA 37993-06. The U.S. Government has certain rights in this invention.

Signed and Sealed this

Twenty-ninth Day of July, 1997

Attest:

BRUCE LEHMAN

Attesting Officer

Commissioner of Patents and Trademarks